(12) United States Patent
Miyamoto (10) Patent No.: US 6,227,345 B1
(45) Date of Patent: May 8, 2001

(54) TRANSFER APPARATUS OF CHIP COMPONENTS

(75) Inventor: Masayuki Miyamoto, Kyoto (JP)

(73) Assignee: Murata Manufacturing Co., Ltd., Nagaokakyo (JP)

( * ) Notice: Subject to any disclaimer, the term of this patent is extended or adjusted under 35 U.S.C. 154(b) by 0 days.

(21) Appl. No.: 09/268,752

(22) Filed: Mar. 17, 1999

(30) Foreign Application Priority Data

Mar. 23, 1998 (JP) .................................................. 10-095457

(51) Int. Cl.$^7$ .................................................. B65G 29/02
(52) U.S. Cl. ............................................. 198/392; 221/167
(58) Field of Search ..................................... 198/380, 392, 198/397.02, 482.1, 493, 803.5; 221/167

(56) References Cited

U.S. PATENT DOCUMENTS

| | | | |
|---|---|---|---|
| 3,042,183 | * 7/1962 | Ackley | 198/392 |
| 3,696,924 | * 10/1972 | Sterling | 221/167 |
| 3,889,591 | * 6/1975 | Noguchi | 198/380 |
| 3,901,373 | * 8/1975 | Rudzinat | 198/493 |
| 4,032,000 | * 6/1977 | Leclerc | 198/803.5 |
| 5,152,390 | 10/1992 | Kuboto et al. . | |
| 5,826,696 | * 10/1998 | Rupp et al. | 198/392 |
| 5,826,697 | * 10/1998 | Mochizuki et al. | 221/167 |
| 5,984,079 | * 11/1999 | Garcia | 198/392 |

FOREIGN PATENT DOCUMENTS

| | | | |
|---|---|---|---|
| 2453699 | * 5/1975 | (DE) | 198/392 |
| 2250496 | 6/1992 | (GB) . | |
| 7-157071 | 6/1995 | (JP) . | |

* cited by examiner

*Primary Examiner*—Dean J. Kramer
(74) *Attorney, Agent, or Firm*—Burns, Doane, Swecker & Mathis, LLP (57) ABSTRACT

A relatively simple and small-sized drive mechanism for high-speed transfer of chip components. A transfer disc is disposed so that it may be inclined to a horizontal surface, and the disc has a transfer groove on the upper surface thereof, and has a cavity at the peripheral edge part of the transfer groove. A chip component is made to fall into the transfer groove in connection with the rotation of the transfer disc. The chip components are aligned in a predetermined direction, and one chip component is maintained in a cavity by effect of gravity. A conveying disc has cavities for receiving chip components from the transfer disc. Those cavities are provided at an equal pitch interval in the outer peripheral portions of the disc. When a chip-component is transferred from the transfer disc to a cavity, an adsorption hold is performed by an air suction hole provided in the cavity. Synchronization is maintained and a continuous drive of the transfer disc and the conveying disc is performed so that both cavities oppose each other.

20 Claims, 8 Drawing Sheets

TRANSFER APPARATUS OF CHIP COMPONENTS

BACKGROUND OF THE INVENTION

1. Field of the Invention

This invention relates to a transfer apparatus which transfers chip components such as chip-type electronic components from one conveying medium to another conveying medium, while separating the chip components from one another.

2. Description of the Related Art

Conventionally, a chip component is transferred to a recess provided in the periphery of a rotor from a parts feeder. After performing the measurement by rotating the chip components intermittently and by maintaining the chip components within the recess, the chip components are transferred from the rotor to a carrier tape and the chip components are provided on the carrier tape. Such a separating conveyor apparatus is disclosed in Unexamined Japanese Patent No. 7-157071, for example.

In this type of the separating conveyor, a feed zone of the parts feeder does not rotate. The rotor needs to be stopped when a chip component is supplied to the rotor. Therefore, the rotor needs to be rotated intermittently (step rotation). Similarly, the carrier tape is driven intermittently.

However, if a rotor requiring step rotation is used, there is a limit on how fast the transfer velocity can become. For example, using the conventional mechanism it is difficult to perform a high-speed transfer more than 2000 pieces/min. Moreover, the inertial force of a rotor is applied to a driving mechanism every time a one-pitch step rotation is performed. For this reason, a strong and large type driving mechanism is required. Additionally, in the conventional conveyor there is a problem that an oscillation is generated whenever the rotor stopped. Especially, in order to perform multiple measurements of the chip components, when using a large-sized rotor, the above mentioned problems become remarkable.

OBJECTS AND SUMMARY OF THE INVENTION

An object of the present invention is to provide a transfer apparatus of the chip components, wherein a high-speed transfer is made possible compared to the conventional step rotation mechanism, and a driving mechanism can be made simple and small-sized such that the generation of oscillations is less.

In order to achieve the above described objectives, the present invention provides a transfer apparatus of chip components comprising: a transfer side conveying disc provided with a plurality of cavities for containing chip components one by one, said plurality of cavities being provided at equal pitch intervals in outer peripheral portions of said transfer side conveying disc; a transferred side conveying medium provided with a plurality of cavities for receiving the chip components one by one, said plurality of cavities being provided at equal pitch intervals in said transferred side conveying medium; a driving means for driving continuously the transfer side conveying disc and the transferred side conveying medium with synchronization, enabling that the cavities of the transfer side conveying disc oppose to the cavities of the transferred side conveying medium in the closest position between the transfer side conveying disc and the transferred side conveying medium.

The chip component held in the cavity of the transfer side conveying disc is driven continuously so that the cavity of the transfer side conveying disc is opposed to the cavity of the transferred side conveying medium with synchronization in the closest position between the transfer side conveying disc and the transferred side conveying medium. Thus, there is little relative velocity between the cavity of the transfer side conveying disc and the cavity of the transferred side conveying medium, and the chip components can be smoothly transferred. Specifically, according to the present invention, the transfer side conveying disc and the transferred side conveying medium are driven not intermittently but continuously. Therefore, high-speed transfer is possible and the generation of oscillations can be suppressed. Further, the driving mechanism is simplified compared with the mechanism in driving intermittently, thereby reducing the size of the apparatus.

In order to transfer chip components, air may be injected from the transfer side conveying disc, or air may be sucked from the transferred side conveying medium. Moreover, gravity may be used for transferring the chip components.

The present invention provides a transfer apparatus of chip components wherein the transfer side conveying disc is disposed so that the upper surface thereof is inclined to a horizontal surface, and the transfer side conveying disc is a scattering disc having a plurality of scattering grooves for aligning the chip components, the grooves being provided from an inner radial side to an outer radial side on the surface of the scattering disc and being extending to the cavities of the transfer side conveying disc, wherein an inclined highest or near highest portion of the scattering disc is in the closest proximity to the transferred side conveying medium. In such an apparatus, when a number of chip components are thrown into the scattering disc in a disorderly mass, those chip components are gathered to a lower part of the scattering disc because of its inclination. In accordance with the rotation of the scattering disc, a part of the chip components fall down into the scattering grooves and aligned in the predetermined direction. In a case of the chip components having a rectangular-parallelepiped shape, if the width of the scattering groove is set to be larger than the shorter side of the chip component and smaller than the longer side of the chip component, the chip components can be aligned in the longitudinal direction within the scattering grooves. Since the scattering grooves are formed to be continuous from the inner radial side to the outer radial side of the scattering disc, the probability of the chip components falling into the scattering grooves is high. The chip components which have fallen into the scattering grooves slide to the outer peripheral end portions of the scattering disc by gravity and enter into the cavities thereof. When the scattering groove is rotated upwards, the chip components slide downward (in the central direction) by gravity, and only the chip components held in the cavities are left. In this way, since the chip components separated one by one are transferred to the cavities of the transferred side conveying medium according to the present invention, the transfer efficiency can be greatly improved compared with the conventional transfer from a parts feeder to a rotor.

The present invention provides a transfer apparatus of chip components wherein the cavities of the transfer side conveying disc hold the chip components in such a state that the chip components project outwardly from the outer peripheral surface of the transfer side conveying disc. Due to such a configuration, when the chip components are transferred from the cavity of the transfer side conveying disc to the cavity of the transferred side conveying medium, the chip components ride on both cavities, thereby making the transfer smooth.

The present invention provides a transfer apparatus of chip components wherein the transferred side conveying medium is a rotating disc provided with a plurality of cavities disposed at equal pitch intervals in the outer peripheral portions of the transferred side conveying medium. In such a case, when the cavity of the transfer side conveying disc is opposed to the cavity of the transferred side conveying medium at the closest position, quite a smooth transfer of the chip components, like the engagement of gears, can be performed by setting the rotating velocity of the disc the same as that of the medium.

The present invention provides a transfer apparatus of chip components wherein the transferred side conveying medium is a continuous conveying body provided with a plurality of cavities disposed at equal pitch intervals on the upper surface of the transferred conveying medium. In such a case, the smooth transfer of the chip components from the transfer side conveying disc to the continuous conveying body is possible. As a continuous conveying body, a carrier tape and a conveying belt may be used.

The present invention provides a transfer apparatus of chip components wherein an air suction path for drawing and holding chip components is provided with each cavity of the transferred side conveying medium. In this case, since the transfer of the chip components from the cavity of the transfer side conveying disc to the cavity of the transferred side conveying medium is secured, problems such as dropping chip components are reduced or avoided. Further, after the transfer is performed, the chip components can be conveyed while holding them in the cavities.

BRIEF DESCRIPTION OF THE DRAWINGS

The present invention will now be described by way of exemplary embodiments illustrated in the accompanying drawings, in which.

DETAILED DESCRIPTION OF PREFERRED EMBODIMENTS

FIGS. 1 to 10 show an example of a transfer apparatus of chip components according to the present invention. In this example, a chip electronic component C of the rectangular-parallelepiped shape is used, as shown in FIG. 11. The height and width of the chip component are H and W (H≈W), respectively. The length L of the chip component C is L (L>H, L>W). Electrodes Ca and Cb are formed on both ends of the lengthwise direction of this chip component C.

Figure 1:
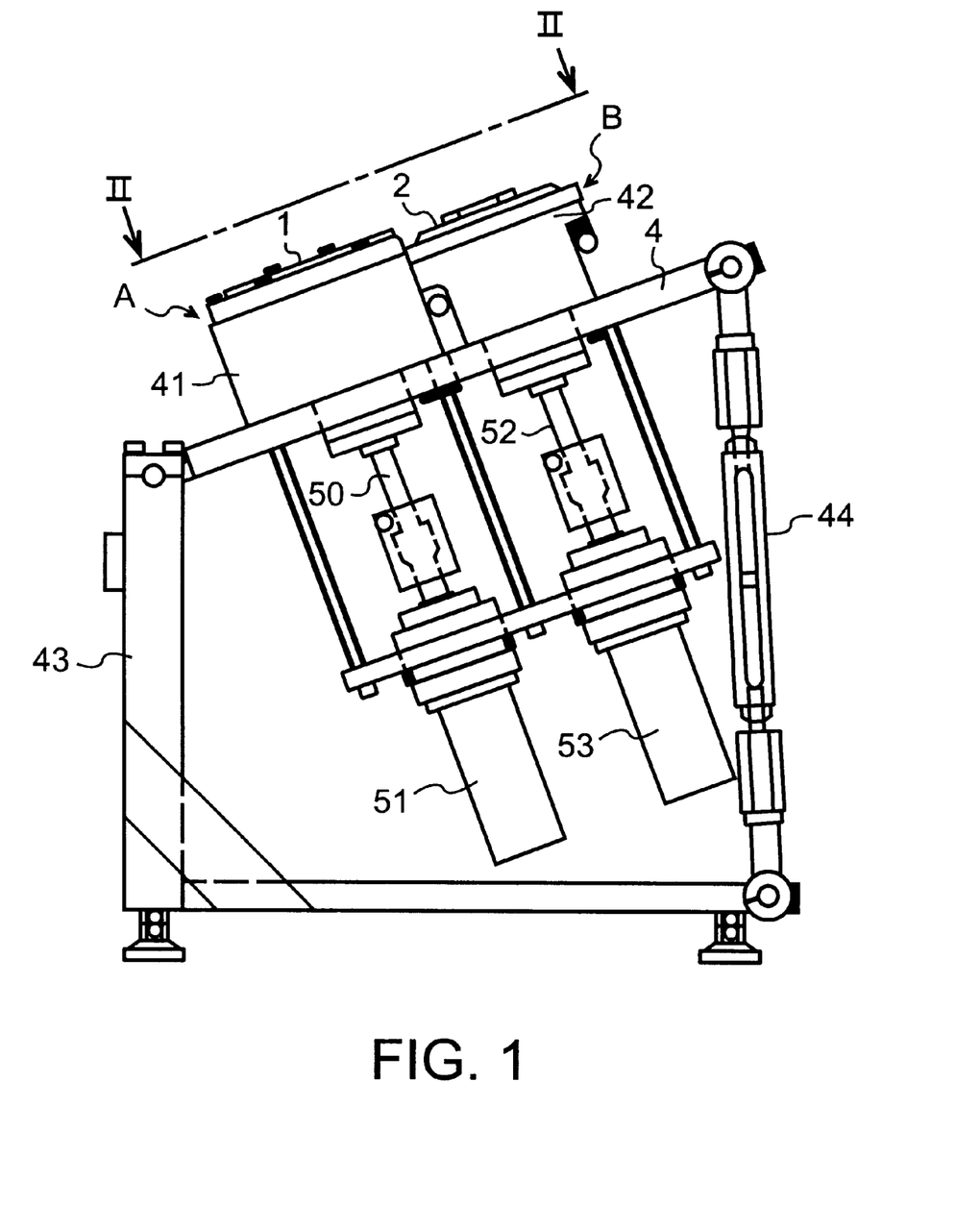
FIG. 1 is a front view of an example of a transfer apparatus according to the present invention.
Figure 2:
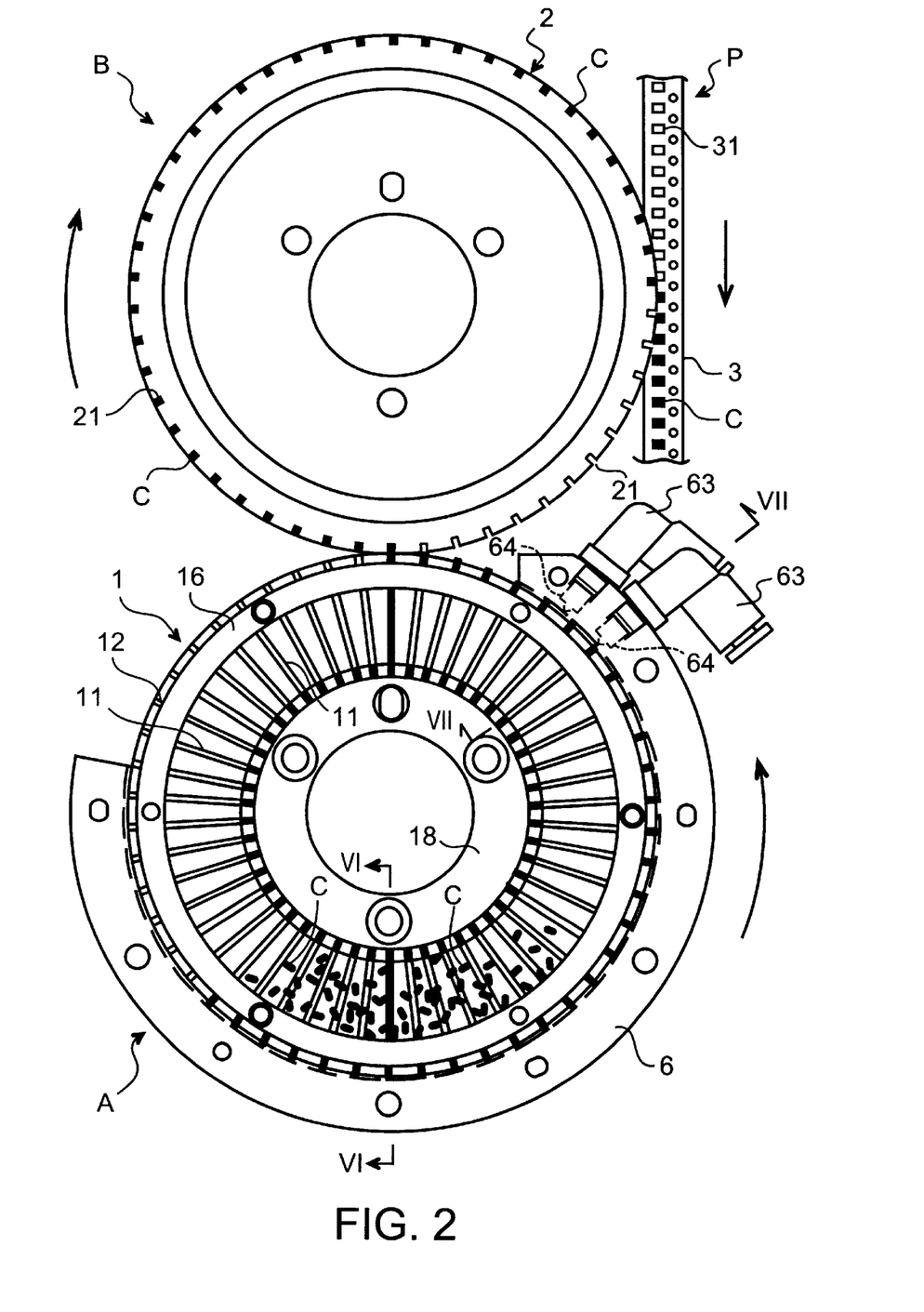
FIG. 2 is a view from the direction of the arrow II of FIG. 1.

The exemplary transfer apparatus includes a feed zone A, a conveying part B, and a package part P, as shown in FIGS. 1 and 2. A transfer disc 1, which is a transfer side conveying disc, is provided in the feed zone A. A conveying disc (turntable) 2, which is a transferred side conveying medium, is provided in the conveying part B. A carrier tape 3 is arranged on the package part P. In the feed zone A, randomly supplied chip components C are individually separated so as to be aligned. In the conveying part B, the chip components C from the feed zone A are received individually, and processes, such as a measurement and a visual inspection, are performed in a conveying process. Only good chip components C are loaded on the carrier tape 3 in the package part P. Defective chip components C are ejected from the conveying part B to an inferior goods extraction part (not illustrated).

Both the transfer disc 1 and the conveying disc 2 are respectively supported in a free-rotating state via bases 41 and 42 on a diagonally inclined table 4. As shown in FIG. 1, the table 4 is supported by an adjustment means 44, such as a turnbuckle, provided on a frame 43 installed on the floor, so that the inclination angle can be adjusted by the adjustment means 44.

Figure 3:
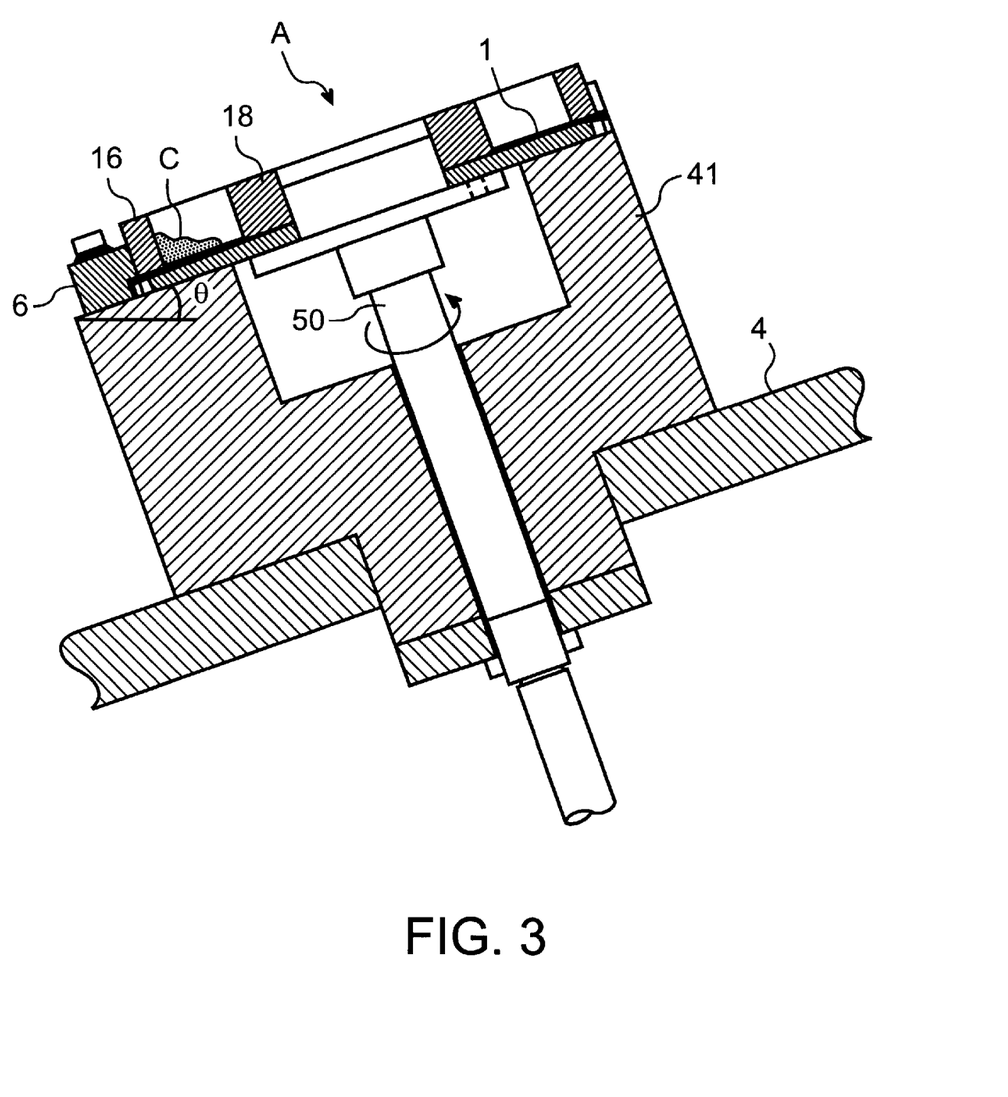
FIG. 3 is a sectional view of a feeding portion of FIG. 1.

The feed zone A is fixed by a drive shaft 50 passing through a central part of the base 41, a motor 51 for continuously driving the drive shaft 50, and the upper surface of the base 41 as shown in FIG. 3. An outside guide 6 surrounding a part of a periphery of the transfer disc 1 is provided with the feed zone A. The transfer disc 1 is coupled with an end portion of the drive shaft 50, and slides on the upper surface of the base 41. Moreover, the conveying part B, as well as the feed zone A, are provided with a drive shaft 52 passed through the central part of the base 42, and a motor 53 for continuously driving the drive shaft 52. The conveying disc 2 is coupled with an end portion of the drive shaft 52, and slides on the upper surface of the base 42.

In this example, as shown by an arrow of FIG. 2, the transfer disc 1 is driven in the direction of an anti-clockwise rotation. The conveying disc 2 is driven in the direction of a clockwise rotation. Synchronization is made and the continuous drive of both discs 1 and 2 is performed so that the circumferential speed of the discs may become identical, and that cavities 12 and 21 may be aligned in a straight line at the closest approach position of the two discs 1 and 2. Moreover, the carrier tape 3 is continuously driven in the tangent direction along adjacent portions of the outer periphery of the conveying disc 2. Synchronization is made and the continuous drive of this carrier tape 3 and the conveying disc 2 is performed so that a circumferential speed of the carrier tape 3 and the conveying disc 2 are maintained identical such that cavities 21 and 31 correspond to each other.

Figure 4:
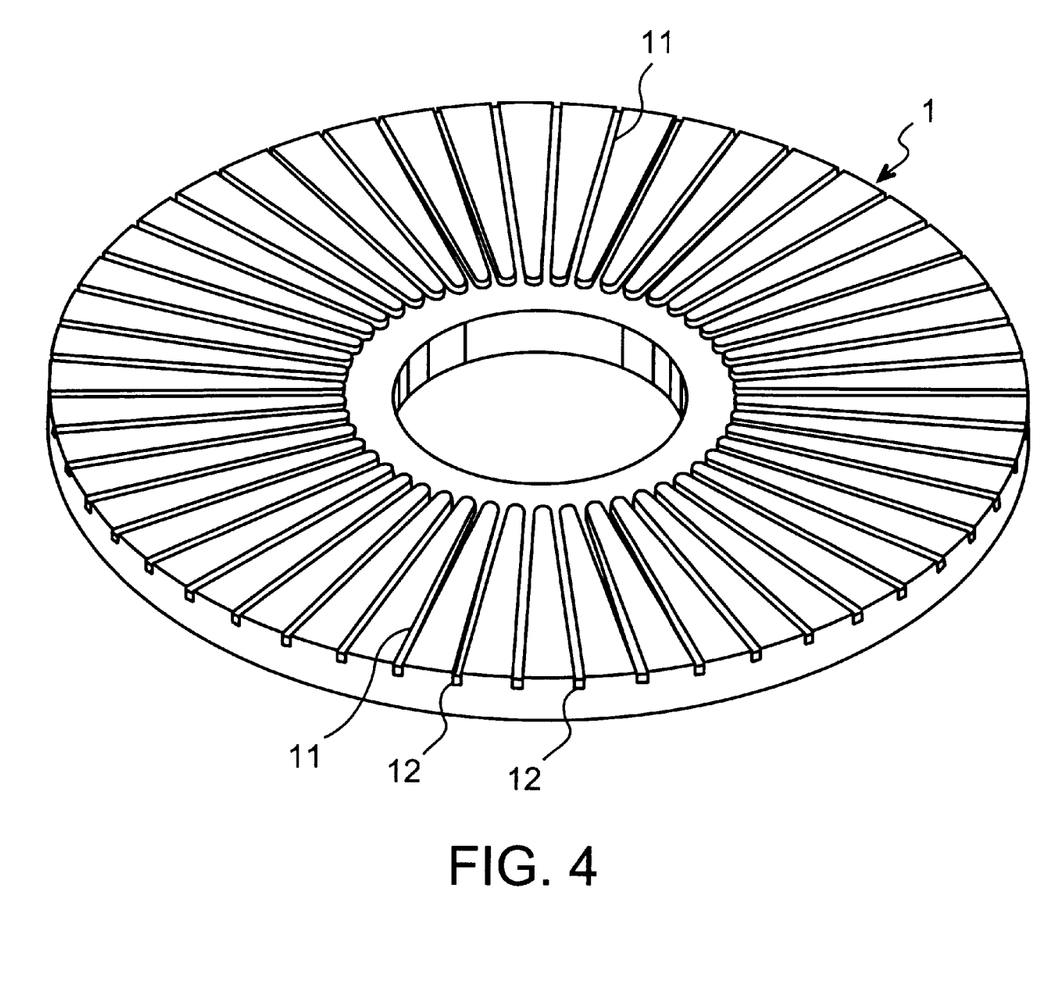
FIG. 4 is a perspective view of a transfer disc.

Here, the feed-zone A is explained in detail. The transfer disc 1 is installed so that the upper surface thereof has a predetermined inclination angle θ (0 degree<θ<90 degrees) to a horizontal surface. As shown in FIG. 4, numerous transfer grooves 11 are formed on the upper surface of the transfer disc 1. The grooves 11 extend radially from an internal diameter part to a periphery edge of the transfer disc 1. The width and the depth of each transfer groove 11 are larger than the short sides H and W of the chip component C, and are set to be smaller than the long side L. Therefore, if a large number of chip components C are supplied on the transfer disc 1 and rotary motion is added to the transfer disc 1, the chip components C will fall into the transfer groove 11 by the effect of gravity. Since the chip components C fall into the transfer groove 11, the chip component C can be aligned in the lengthwise direction.

Figure 5:
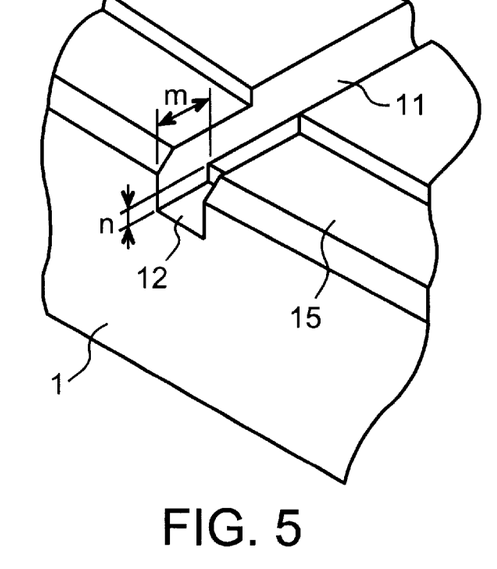
FIG. 5 is an enlarged perspective view of a periphery edge part of a transfer groove.
Figure 6:
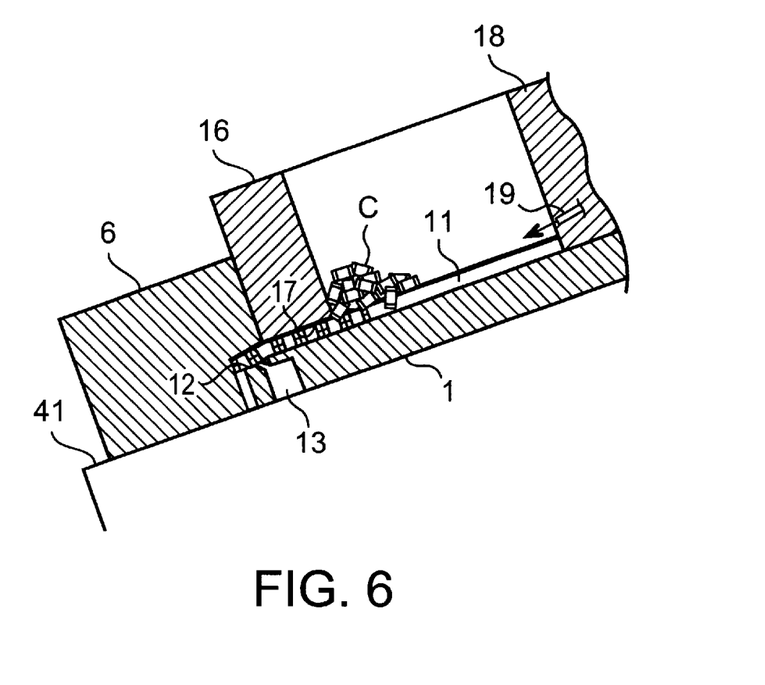
FIG. 6 is an expanded sectional view of VI—VI line of FIG. 2.

As shown in FIG. 5, a step hole shaped cavity 12 which can hold only one chip component C is provided in the periphery edge part of the transfer groove 11. In addition, in this example, since radial length m of a cavity 12 is shorter than the long side L of the chip component C, a part of the chip component C contained by the cavity 12 is projected from the periphery surface side of the transfer disc 1. A step n in the bottom surface between the cavity 12 and the transfer groove 11 is smaller than the width W of the short side of chip component C. Therefore, even if consecutive chip components C in the transfer groove 11 in a downward condition tend to move to the cavity 12, moving to the outer diameter direction is regulated by the chip component C contained in the cavity 12 (See FIG. 6). An air suction opening 13 is formed on an internal circumference part of the cavity 12.

When the transfer disc 1 rotates and the cavity 12 corresponds with an air blowing opening 64 mentioned later (FIG. 7), the air suction opening 13 is connected with a negative pressure source 14. Therefore, the chip component C contained in the cavity 12 is drawn and held at the internal circumference side of the cavity 12. This can prevent the chip component C from detaching from the cavity 12 due to the blowing power of a separating air from the air blowing opening 19 mentioned later. A concave step 15 is formed on a periphery upper surface of the transfer disc 1 in the shape of a ring (See FIG. 5).

A guide ring 16 (which forms a gate opening 17 making only the chip component C aligned in the transfer groove 11 movable in the direction of a periphery of the transfer disc 1) is fixed on the upper-surface periphery of the transfer disc 1. Moreover, an inside ring 18 is fixed in an internal diameter side end portion of the transfer groove 11, that is on the upper surface of the transfer disc 1. Therefore, an annular accommodation space for containing many chip components C is formed on the upper surface of the transfer disc 1 between the inside ring 18 and the guide ring 16.

A plurality of air blowing openings 19 (FIG. 6) facing in the radiation direction are formed in the above mentioned inside ring 18 at equal intervals. Air blows out from the air blowing opening 19 in a downward direction. This provides an opportunity to slide chip components C stuck (not sliding) in the transfer groove 11 downward (toward the outer diameter direction).

The above mentioned guide ring 16 has the following effects. A surface which contacts chip components C of the outside guide 6 fixed to the base 2, has a relative speed with respect to chip components C on the transfer disc 1 which performs rotary motion. If the structure is such that chip components C not aligned in the transfer groove 11 contact the outside guide 6 directly, the chip-components C will receive the external force from a random direction according to their condition (position) at that time. When the rotating speed of the transfer disc 1 is set relatively high, and when a micro chip component is treated, the external force applied to the chip component C will be very large compared with an effect received with a tare weight, and the above mentioned external force cannot be ignored in the quality of the chip components C. Consequently, the guide ring 16 rotating integrally to the transfer disc 1 is fixed for the purpose of reducing the damage to the chip component C.

Moreover, as a role of the guide ring 16, besides the above, includes a function of forming the gate opening 17 which transfer only the chip component C aligned in the transfer groove 11 to the periphery of the transfer disc 1, without disturbing a position of the chip component. For example, although there may be a case of a chip component C in the transfer groove 11 slides to the cavity 12 in standing up position, such a chip component C is controlled by the inner edge of the gate opening 17. Therefore, the position that the chip component C aligned in the transfer groove 11 contacts the outside guide 6 is fixed, and both side surfaces of the chip components C were guided by the side surface of the transfer groove 11. While the external force applied to the chip component C is made to the minimum, the cavity 12 does not maintain the chip component C in this abnormal direction.

Figure 8:
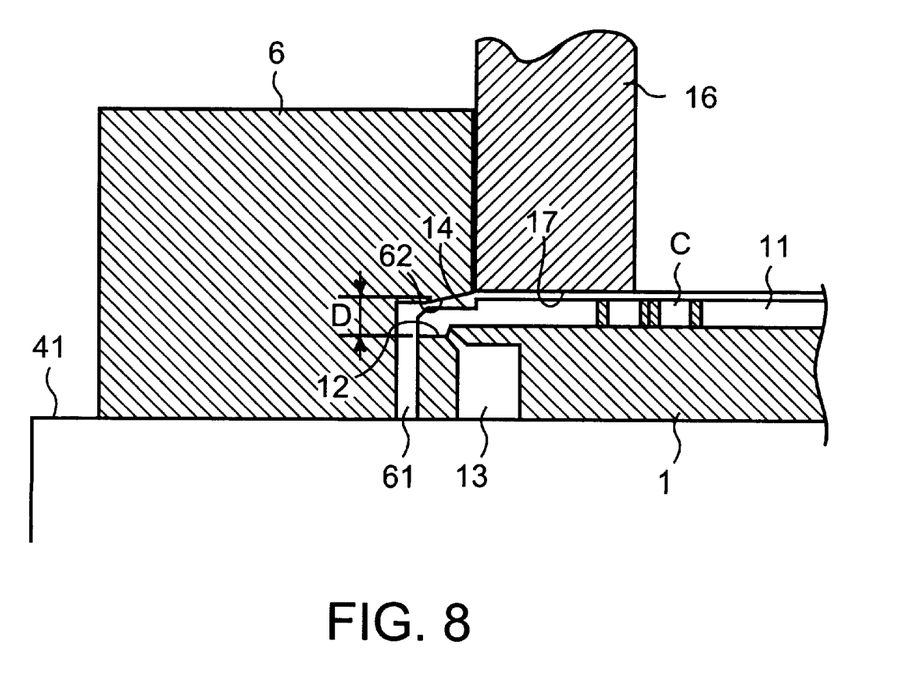
FIG. 8 is an expanded sectional view of a part of FIG. 3.

As shown in FIG. 8, an outside guide 6 is disposed having an appropriate gap 61 so that the area of the periphery, especially the lower half of the transfer disc 1, may be surrounded in order that the chip component C having slid in the transfer groove 11 may not fall from the transfer disc 1. In this example, the transfer disc 1 is surrounded by the outside guide 6 in the range of about 240 degrees of the transfer disc 1. A guide surface 62 of a taper shape corresponding to the concave step 14 of the transfer disc 1 is formed on the internal circumference part of the outside guide 6. This guide surface 62 guides so that the chip component C arriving at the periphery edge part of the transfer groove 11 may be contained smoothly in the cavity 12.

In addition, in order to prevent another chip component C from being fed on the chip component C contained in the cavity 12, a space D between the base of the cavity 12 and the guide surface 62 is set as described below. In addition, W is the width of the short side of the chip component C:

$$W<D<2W.$$

Figure 7:
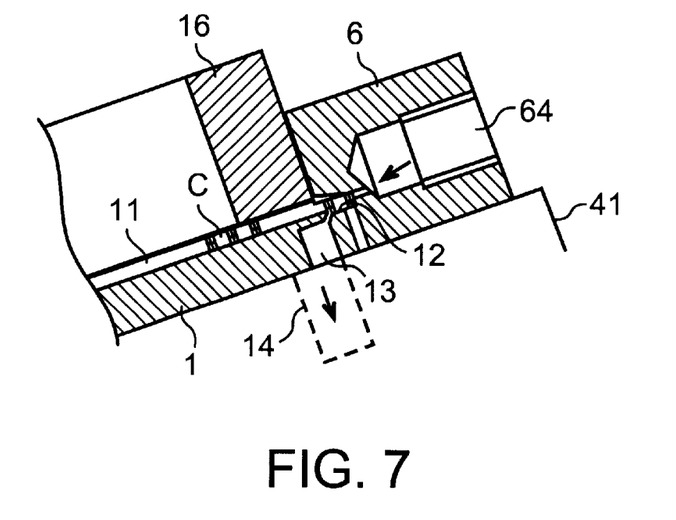
FIG. 7 is an expanded sectional view of VII—VII line of FIG. 2.

As shown in FIG. 2, a nozzle 63 for ejecting air to help the separation of one chip component C is connected near the upper end part of the circular outside guide 6. Two nozzles 63 are connected in this example. As shown in FIG. 7, the end of the nozzle 63 is connected with the air blowing opening 64 which faces in the internal diameter direction. Chip components C in the transfer groove 11 except the chip component C in the cavity 12 are pushed in the internal diameter direction (downward) by the air ejected from this air blowing opening 64. Therefore, the chip component C which did not slip into place completely by the gravity can be forcibly slid lower, and only the one chip component C in the cavity 12 can be separated reliably. Specifically, if the transfer disc 1 is rotated in a high speed, since the centrifugal force applied to the chip component C in the transfer groove 11 will become large, returning the chip component C in the internal diameter direction only by gravity becomes difficult. However, by ejecting the separating air as mentioned above, one piece can be separated reliably and it can correspond to the high speed rotation. In addition, in order to raise the reliability of the piece separating function by air, it is effective to provide a plurality of air blowing openings 64 in a peripheral direction as in the example.

In addition, the separating air has the following functions:
(1) It functions to blow back chip components C which are not completely contained in the cavity 12 into the transfer disc 1 when transferring another chip component C to the transfer disc 1; and (2) It functions to drop the chip components C which are transferred to the upper part of the transfer disc 1 by the rotary motion of the transfer disc 1 and remaining on the surface of the transfer disc 1 without being transferred into the transfer groove 11. In order to perform this function effectively, it is sufficient to provide a gap smaller than the chip component C between the guide ring 16 and the transfer disc 1.

Next, the operation of the chip component feed zone A of the above mentioned construction will be explained.

First, a number of chip components C are supplied to the upper surface of the transfer disc 1 currently being rotated, particularly in the accommodation space surrounded by the inside ring 18 and the guide ring 16. Because the upper surface of the transfer disc 1 inclines, the chip components C are collected on the lower part of the transfer disc 1 due to gravity, and one part of the chip components C falls and is aligned in the transfer groove 11. Chip components C which fell into the transfer groove 11 slip downward by gravity. Only one chip component C at the end is contained in the cavity 12. In addition, the chip components C which did not fall into the transfer groove 11 at first gradually fall into the transfer groove 11 by the agitation effect and the position variation by the rotation of the transfer disc 1.

If the transfer groove 11 into which the chip components C fell rotates upwards, the groove 11 will leave only the chip component C in a cavity 12 by gravity. The other chip components C will slide downward along the transfer groove 11. Some chip components C do not slip downward depending on the inclination angle 0 of the transfer disc 1. However, those chip component C are blown back on the transfer disc 1 by the separating air ejected from the air blowing opening 64. Only one chip component C in the cavity 12 is separated. In addition, the chip component C is absorbed and held in the cavity 12 by the air suction opening 13, thereby preventing the chip component C from dropping off from the cavity 12 by the separating air.

In connection with the rotation of the transfer disc 1, the chip component C separated and held individually in the cavity 12 is transferred to the upper part of the transfer disc 1 and exposed at the extraction position, i.e., where outside guide 6 is lacking. Here, the chip component C is transferred to the conveying disc 2 of the conveying part B from the cavity 12.

The conveying part B is explained. In the conveying part B, various processes, such as a measurement and a visual inspection, are performed as mentioned above.

Figure 9:
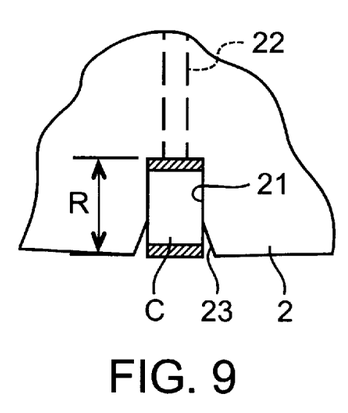
FIG. 9 is an expanded view of a part of a conveying disc.

The conveying disc 2 is provided with many cavities 21 in a periphery thereof at intervals of an equal pitch. As shown in FIG. 9, an air suction hole 22 is formed on an internal circumference side of the cavity 21 and is connected with a negative pressure source (not illustrated). In this example, a radial length R of a cavity 21 is substantially set equally with a long side L of the chip component C. Moreover, a taper part 23 of a shape of expansion is formed on an exterior opening of the cavity 21, and the transfer movement of chip components C from the transfer disc 1 to the conveying disc 2 is made smooth, which would be mentioned later.

Figure 10A:
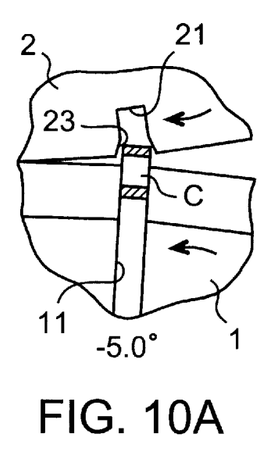
FIGS. 10A, 10B and 10C are explanatory drawings showing the transfer operation of the chip component from a transfer disc to a conveying disc.
Figure 10B:
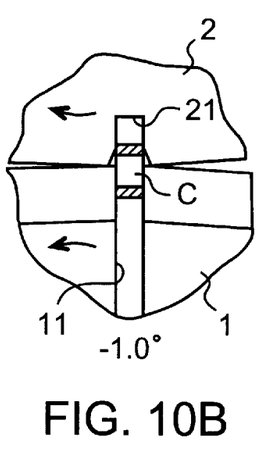
Figure 10C:
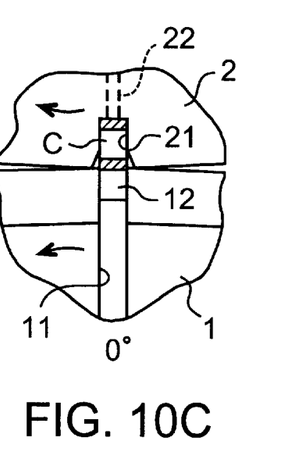
Figure 11:
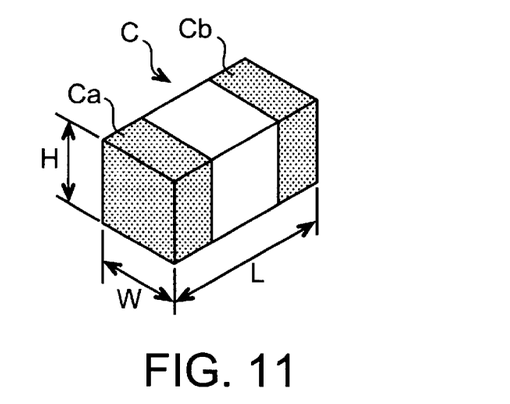
FIG. 11 is a perspective view of an example of a chip component.

Here, the transfer movement of chip components C from the transfer disc 1 to the conveying disc 2 is explained according to FIGS. 10A, 10B and 10C.

FIG. 10A shows a condition of 5 degrees this side from the closest point of approach (transferring point) of the transfer disc 1 and the conveying disc 2. As for chip component C, it is maintained in the cavity 12 of the transfer disc 1 with one part thereof being projected toward the outer diameter direction, and the projection part of this chip component C is inserted within a cavity 21, without interfering with the conveying disc 2 by the taper part 23. In addition, the air suction to the cavity 12 of the transfer disc 1 is stopped at the point when the rotation is made to this state. The air suction to the cavity 21 of the conveying disc 2 is done simultaneously.

FIG. 10B shows a condition of 1 degree this side from the closest point of approach of the transfer disc 1 and the conveying disc 2. The projection part of the chip component C is in the condition of exceeding the taper part 23 and having been inserted still deeply within the cavity 21 of the conveying disc 2. The chip component C is guided by both side walls of the cavity 21, and is corrected to the fixed direction.

FIG. 10C shows a condition of the closest point of approach (0 degrees) of the transfer disc 1 and the conveying disc 2. At this time, the chip component C is drawn from the cavity 12 of the transfer disc 1 by the air suction force from the air suction hole 22 to the cavity 21 of the conveying disc 2 and is transferred smoothly.

In addition, in order to enhance the transfer reliability, a cover may be provided in the upper part near the transferring point (0 degrees) for the purpose of reducing leak of the air suction force from the conveying disc 2.

Next, a package part P is explained.

A carrier tape 3 of this example is for performing the taping of chip components C. A carrier 31 is formed on an upper surface of the tape 3 at intervals of equal pitch. While the chip component C rotates to the predetermined position by the conveying disc 2 is transferred to the carrier tape 3 of the package part P, a cavity 31 is loaded with the chip component C one by one at the same time. As this transferring operation, for example, there is a following method. First, the carrier tape 3 is made to move along the periphery bottom surface of the conveying disc 2. Then, the air suction of the cavity 21 is stopped at the point when the cavity 21 of the conveying disc 2 and the cavity 31 of the carrier tape 3 correspond vertically. Due to this, the chip components drop in the cavity 31 of the carrier tape 3 with gravity, the cavity 31 is loaded with the chip component C. Also in this case, the conveying disc 2 and the carrier tape 3 are continuously driven in the identical circumferential speed, and the conveying disc 2 and the carrier tape 3 are synchronized so that both cavities 21 and 31 may correspond vertically.

In addition, the transfer operation of the chip component C from the conveying disc 2 to the carrier tape 3 may not be restricted to the above described method utilizing the gravity, and may utilize air suction, air injection, etc. Moreover, the carrier tape 3 is not restricted to the structure which moves along the bottom surface of the conveying disc 2.

As mentioned above, a supply capability becomes high very by using the transfer disc 1 which has many transfer grooves 11. For example, when fifty transfer grooves 11 are provided in the transfer disc 1 and the transfer disc 1 is rotated continuously by sixty times/min., the supply capability also becomes 3000 piece/min. Thus, a feed zone A with markedly high efficiency can be attained compared with a conventional parts feeder. Because the delivery operation from the feed zone A to the conveying part B and the delivery operation from the conveying part B to the package part P can also be performed extremely smoothly, a measurement, an inspection, and a packaging can be done without reducing the above mentioned supply capability.

Figure 12:
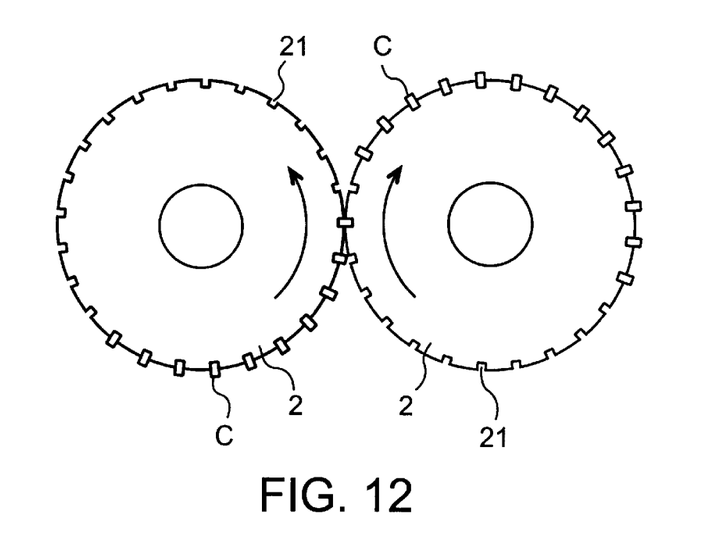
FIG. 12 is a plan view of another example of a transfer apparatus according to this invention.

Although the transfer disc 1 functions as the transfer side conveying disc and the conveying disc 2 functions as the transferred side conveying medium in the above mentioned example, as shown in FIG. 12, it is also possible to use the conveying disc 2 as both the transfer side conveying disc and the transferred side conveying medium.

Figure 13:
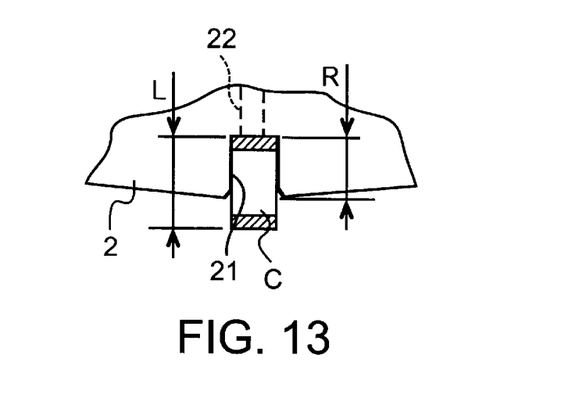
FIG. 13 is an expanded view of a part of the conveying disc in FIG. 12.

In this case, if the radial length R of the cavity 21 of both conveying discs 2 is made shorter than the length L of chip component C as shown in FIG. 13, the transfer distance of the chip component C from one conveying disc 2 to another conveying disc 2 will be small, thereby improving the transfer reliability. In addition, the air suction hole 22 may be provided in the cavity 21 of both conveying discs 2 also in this case.

Needless to say, this invention is not limited to the structure of the above mentioned example.

For example, in the above-mentioned example, although the chip component of a rectangular-parallelepiped shape was explained, the chip component of the other shapes, such as a cube shape, a cylinder shape, and a disc shape, is applicable. Therefore, the shapes of a transfer groove and a cavity may be changed in accordance with the shapes of the chip component.

Moreover, although the transfer disc 1 was used as the feed-zone A in the example of FIG. 1–10, the transfer disc 1 may be replaced with a feeder structure which supplies a chip component C one by one to the cavity of the conveying disc rotated continuously. Therefore, it is not limited to a structure utilizing the feed zone A as the transfer disc 1.

By the above explanation, according to this invention, in the closest approach position of a transfer side conveying disc and a transferred side conveying medium, a synchronization is taken and a continuous drive is performed between the transfer side conveying disc and the transferred side conveying medium so that a cavity of the transfer side conveying disc and a cavity of the transferred side conveying medium might face each other. Therefore, a generation of an oscillation can be suppressed and a high speed transfer can be attained compared with the system which transfers the chip components by step rotation.

Moreover, a drive mechanism can be simplified and reduced in size compared with the intermittent drive. For the inertia force of the disc hardly effects to the drive mechanism, because the disc may be just rotated continuously at fixed velocity.

What is claimed is:

1. A transfer apparatus of chip components, comprising:
    a transfer side conveying disc provided with a plurality of cavities for containing chip components one by one, said plurality of cavities being provided at pitch intervals on outer peripheral portions of said transfer side conveying disc;
    a transferred side conveying medium provided with a plurality of cavities for receiving the chip components one by one, said plurality of cavities being provided at pitch intervals on said transferred side conveying medium;
    a driving means for continuously driving the transfer side conveying disc and the transferred side conveying medium in synchronization, wherein the cavities of the transfer side conveying disc oppose the cavities of the transferred side conveying medium at a position where the transfer side conveying disc and the transferred side conveying medium are closest; and
    wherein said transfer side conveying disc is disposed so that the upper surface thereof is inclined to horizontal and an inclined highest portion of the transfer side conveying disc is in the closest proximity to the transferred side conveying medium.

2. A transfer apparatus of chip components according to claim 1, wherein said transfer side conveying disc is a scattering disc having a plurality of scattering grooves for aligning the chip components, said grooves extending from an inner radial position to an outer radial side of the scattering disc and extending to the cavities of the transfer side conveying disc.

3. A transfer apparatus of chip components according to claim 2, wherein said cavities of the transfer side conveying disc are dimensioned to hold the chip components so that the chip components in said cavities project outward from an outer peripheral surface of the transfer side conveying disc.

4. A transfer apparatus of chip components according to claim 2, wherein said cavities of the transfer side conveying disc include a step portion having a depth measurement smaller than a length measurement of said chip components.

5. A transfer apparatus of chip components according to claim 2, further comprising a base supporting said transfer side conveying disc, wherein said base includes an air blowing opening for blowing air onto chip components in said cavities of said transfer side conveying disc adjacent to said position where the transfer side conveying disc and the transferred side conveying medium are closest.

6. A transfer apparatus of chip components according to claim 2, wherein said transferred side conveying medium is a rotating disc provided with a plurality of cavities disposed at equal pitch intervals in outer peripheral portions of the transferred side conveying medium.

7. A transfer apparatus of chip components according to claim 2, wherein said transferred side conveying medium is a continuous conveying body provided with a plurality of cavities disposed at equal pitch intervals on the upper surface of the transferred conveying medium.

8. A transfer apparatus of chip components according to claim 2, wherein each cavity of the transferred side conveying medium includes an air suction path for drawing and holding chip components.

9. A transfer apparatus of chip components according to claim 1, wherein said cavities of the transfer side conveying disc are dimensioned to hold the chip components so that the chip components in said cavities project outward from an outer peripheral surface of the transfer side conveying disc.

10. A transfer apparatus of chip components according to claim 9, further comprising a base supporting said transfer side conveying disc, wherein said base includes an air blowing opening for blowing air onto chip components in said cavities of said transfer side conveying disc adjacent to said position where the transfer side conveying disc and the transferred side conveying medium are closest.

11. A transfer apparatus of chip components according to claim 9, wherein said transferred side conveying medium is a rotating disc provided with a plurality of cavities disposed at equal pitch intervals in outer peripheral portions of the transferred side conveying medium.

12. A transfer apparatus of chip components according to claim 9, wherein said transferred side conveying medium is a continuous conveying body provided with a plurality of cavities disposed at equal pitch intervals on the upper surface of the transferred conveying medium.

13. A transfer apparatus of chip components according to claim 9, wherein each cavity of the transferred side conveying medium includes an air suction path for drawing and holding chip components.

14. A transfer apparatus of chip components according to claim 1, wherein said cavities of the transfer side conveying disc include a step portion having a depth measurement smaller than a length measurement of said chip components.

15. A transfer apparatus of chip components according to claim 1, wherein said cavities of the transfer side conveying disc includes a guide ring attached thereto for aligning said chip components in said plurality of cavities provided at pitch intervals on outer peripheral portions of said transfer side conveying disc.

16. A transfer apparatus of chip components according to claim 1, further comprising a base supporting said transfer side conveying disc, wherein said base includes an air blowing opening for blowing air onto chip components in said cavities of said transfer side conveying disc adjacent to said position where the transfer side conveying disc and the transferred side conveying medium are closest.

17. A transfer apparatus of chip components according to claim 1, wherein said transferred side conveying medium is a rotating disc provided with a plurality of cavities disposed at equal pitch intervals in outer peripheral portions of the transferred side conveying medium.

18. A transfer apparatus of chip components according to claim 1, wherein said transferred side conveying medium is a continuous conveying body provided with a plurality of cavities disposed at equal pitch intervals on the upper surface of the transferred conveying medium.

19. A transfer apparatus of chip components according to claim 1, wherein each cavity of the transferred side conveying medium includes an air suction path for drawing and holding chip components.

20. A transfer apparatus of chip components, comprising:

a transfer side conveying disc provided with a plurality of cavities for containing chip components one by one, said plurality of cavities being provided at pitch intervals on outer peripheral portions of said transfer side conveying disc;

a transferred side conveying medium provided with a plurality of cavities for receiving the chip components one by one, said plurality of cavities being provided at pitch intervals on said transferred side conveying medium;

a driving means for continuously driving the transfer side conveying disc and the transferred side conveying medium in synchronization, wherein the cavities of the transfer side conveying disc oppose the cavities of the transferred side conveying medium at a position where the transfer side conveying disc and the transferred side conveying medium are closest; and a base supporting said transfer side conveying disc, wherein said base includes an air blowing opening for blowing air onto chip components in said cavities of said transfer side conveying disc adjacent to said position where the transfer side conveying disc and the transferred side conveying medium are closest.

* * * * *